(12) United States Patent
Lee

(10) Patent No.: US 8,841,594 B2
(45) Date of Patent: Sep. 23, 2014

(54) RAMP SIGNAL GENERATOR AND IMAGE SENSOR

(75) Inventor: Hee Bum Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 486 days.

(21) Appl. No.: 13/171,505

(22) Filed: Jun. 29, 2011

(65) Prior Publication Data

US 2012/0001055 A1 Jan. 5, 2012

(30) Foreign Application Priority Data

Jun. 30, 2010 (KR) ........................ 10-2010-0063072

(51) Int. Cl.
| | | |
|---|---|---|
| *H01L 27/146* | (2006.01) | |
| *H03M 1/12* | (2006.01) | |
| *H03K 4/06* | (2006.01) | |
| *G05F 1/00* | (2006.01) | |
| *H03M 1/58* | (2006.01) | |
| *H04N 5/378* | (2011.01) | |
| *H03K 4/08* | (2006.01) | |

(52) U.S. Cl.
CPC . *H03K 4/08* (2013.01); *H04N 5/378* (2013.01)
USPC ............... 250/208.1; 348/216.1; 348/229.1; 348/308; 323/288; 327/134; 327/137; 341/155; 341/157; 341/170

(58) Field of Classification Search
USPC ............. 250/208.1, 214 R, 214 SW, 214 P; 348/216.1, 229.1, 294, 300, 301, 302, 348/308, 311, 312; 323/271, 282, 288; 327/131, 134, 136, 137, 140; 341/157, 341/170, 172, 155, 166, 169
See application file for complete search history.

(56) References Cited

U.S. PATENT DOCUMENTS

| | | | | |
|---|---|---|---|---|
| 6,243,034 B1* | 6/2001 | Regier | ......................... | 341/166 |
| 6,456,220 B1* | 9/2002 | Leung et al. | .................. | 341/155 |
| 6,545,624 B2* | 4/2003 | Lee et al. | ...................... | 341/155 |
| 6,727,486 B2* | 4/2004 | Choi | ........................ | 250/208.1 |
| 6,885,331 B2* | 4/2005 | Krymski | ....................... | 341/169 |
| 7,218,265 B2* | 5/2007 | Roh et al. | ....................... | 341/169 |
| 7,230,561 B2* | 6/2007 | Lee | ................. | 341/172 |
| 7,379,011 B2* | 5/2008 | Ham et al. | ..................... | 341/170 |
| 7,492,401 B2* | 2/2009 | Lim | ............................. | 348/300 |
| 7,498,792 B2* | 3/2009 | Chang et al. | .................. | 323/288 |
| 7,554,479 B2* | 6/2009 | Lim | ............................. | 341/169 |
| 7,659,845 B2* | 2/2010 | Bresch | ......................... | 341/172 |
| 7,746,521 B2* | 6/2010 | Lee | ............................. | 358/482 |

(Continued)

FOREIGN PATENT DOCUMENTS

| | | |
|---|---|---|
| KR | 1020020058487 A | 7/2002 |
| KR | 1020060134578 A | 12/2006 |
| KR | 1020090069803 A | 7/2009 |

*Primary Examiner* — John Lee
(74) *Attorney, Agent, or Firm* — William Park & Associates Patent Ltd.

(57) ABSTRACT

Disclosed are a ramp signal generator and an image sensor. The ramp signal generator includes: a comparator comparing a first bias voltage input to a first input terminal and a second bias voltage input to a second input terminal and outputting a ramp signal from an output terminal; a ramp signal adjustment unit including a plurality of switched capacitors made up of switches and capacitors connected in series, and connected in parallel between a first input terminal of the comparator and an output terminal of the comparator; and a controller switching the switches of the plurality of switched capacitors to adjust the ramp signal output from the comparator such that the ramp signal becomes nonlinear over time.

18 Claims, 3 Drawing Sheets

(56) References Cited

U.S. PATENT DOCUMENTS

| | | |
|---|---|---|
| 8,228,410 B2 * | 7/2012 | Raynor et al. ............... 348/301 |
| 2002/0067303 A1 * | 6/2002 | Lee et al. ...................... 341/184 |
| 2002/0118289 A1 * | 8/2002 | Choi ............................. 348/308 |
| 2002/0122129 A1 | 9/2002 | Lee |
| 2005/0057389 A1 * | 3/2005 | Krymski ....................... 341/169 |
| 2005/0168601 A1 * | 8/2005 | Lim .............................. 348/241 |
| 2006/0164277 A1 * | 7/2006 | Lee ............................... 341/155 |
| 2006/0273769 A1 * | 12/2006 | Chang et al. ................. 323/271 |
| 2006/0290552 A1 | 12/2006 | Roh et al. |
| 2007/0046513 A1 * | 3/2007 | Ham et al. .................... 341/118 |
| 2008/0042888 A1 * | 2/2008 | Danesh ......................... 341/157 |
| 2008/0225140 A1 * | 9/2008 | Raynor et al. ................ 348/243 |
| 2009/0066554 A1 * | 3/2009 | Lim .............................. 341/155 |
| 2009/0174442 A1 * | 7/2009 | Kim et al. ..................... 327/134 |
| 2010/0289936 A1 * | 11/2010 | Kimura et al. ............... 348/308 |
| 2011/0050473 A1 * | 3/2011 | Jung et al. .................... 341/143 |
| 2011/0068763 A1 * | 3/2011 | Chang et al. ................. 323/288 |
| 2012/0001055 A1 * | 1/2012 | Lee ............................. 250/208.1 |

\* cited by examiner

PRIOR ART

(a)

(b)

RAMP SIGNAL GENERATOR AND IMAGE SENSOR

CROSS-REFERENCE TO RELATED APPLICATIONS

This application claims the priority of Korean Patent Application No. 10-2010-0063072 filed on Jun. 30, 2010, in the Korean Intellectual Property Office, the disclosure of which is incorporated herein by reference.

BACKGROUND OF THE INVENTION

1. Field of the Invention

The present disclosure relates to a ramp signal generator and an image sensor.

2. Description of the Related Art

An image sensor is a device for capturing an image by using the property of semiconductors that react to light, and recently, the development of a CMOS (Complementary Metal-Oxide-Semiconductor) technique has promoted the common use of a CMOS image sensor.

The CMOS image sensor, which employs a CDS (Correlated Double Sampling) scheme, outputs the difference between a reset signal sampled according to the CDS scheme, and an image signal, as a digital signal.

Here, in order to output the difference between the reset signal and the image signal, as a digital signal, a ramp signal is used. For example, the CMOS image sensor picks up the difference between the image signal that varies according to the intensity of illumination of external light and the reset signal, converts the difference into a digital signal according to the slope of the ramp signal, and outputs the same.

In this case, on the assumption that the slope of the ramp signal is constant, when a portion (a brighter portion) in which the difference between the image signal and the reset signal is large and a portion (a darker portion) in which the difference between the image signal and the reset signal is small coexist, if the slope of the ramp signal is steep, it would be difficult to read a fine difference between pixels in the darker portion, making it impossible to discriminate the pixels. Conversely, if the slope of the ramp signal was gentle, pixels at the brighter portion could not be discriminated.

SUMMARY OF THE INVENTION

An aspect of the present invention provides a ramp signal generator generating a ramp signal allowing for distinguishing the difference between pixels in a brighter portion of an image and pixels in a darker portion of the image, and an image sensor.

According to an aspect of the present invention, there is provided a ramp signal generator including: a comparator comparing a first bias voltage input to a first input terminal and a second bias voltage input to a second input terminal and outputting a ramp signal from an output terminal; a ramp signal adjustment unit including a plurality of switched capacitors made up of switches and capacitors connected in series, and connected in parallel between a first input terminal of the comparator and an output terminal of the comparator; and a controller switching the switches of the plurality of switched capacitors to adjust the ramp signal output from the comparator such that the ramp signal becomes nonlinear over time.

According to another aspect of the present invention, there is provided an image sensor including: a pixel array generating a reset signal and an image signal; a ramp signal generator outputting a ramp signal; and an analog-to-digital converter (ADC) performing correlated double sampling on the reset signal and the image signal by using the ramp signal to generate a digital signal, wherein the ramp signal generator includes: a comparator comparing a first bias voltage input to a first input terminal and a second bias voltage input to a second input terminal and outputting a ramp signal from an output terminal; a ramp signal adjustment unit including a plurality of switched capacitors made up of switches and capacitors connected in series, and connected in parallel between a first input terminal of the comparator and an output terminal of the comparator; and a controller switching the switches of the plurality of switched capacitors to adjust the ramp signal output from the comparator such that the ramp signal becomes nonlinear over time.

BRIEF DESCRIPTION OF THE DRAWINGS

The above and other aspects, features and other advantages of the present invention will be more clearly understood from the following detailed description taken in conjunction with the accompanying drawings, in which:

FIGS. 2(a) and 2(b) are views showing waveforms of ramp signals, in which FIG. 2(a) is a graph of the waveform of a ramp signal output from the related art ramp signal generator, and FIG. 2(b) is a graph of the waveform of a ramp signal output from a ramp signal generator according to an exemplary embodiment of the present invention.

DETAILED DESCRIPTION OF THE PREFERRED EMBODIMENT

Figure 1:
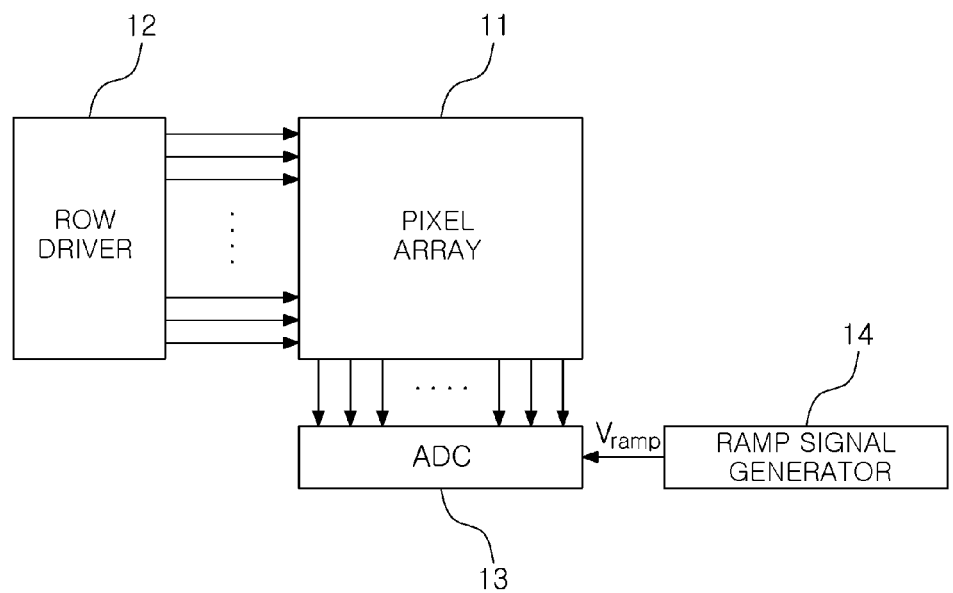
FIG. 1 is a schematic block diagram of an image sensor including a general ramp signal generator.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components. The terminology "operatively coupled" as used herein refers to coupling that enables operational and/or functional communication and relationships there-between and may include any intervening items necessary to enable such communication such as, for example, data communication buses or any other necessary intervening items that one of ordinary skill would understand to be present. Also, it is to be understood that other intervening items may be present between "operatively coupled" items even though such other intervening items are not necessary to the functional communication facilitated by the operative coupling. For example, a data communication bus may provide data to several items along a pathway along which two or more items are operatively coupled, etc. Such operative coupling is shown generally in the figures described herein.

FIG. 1 is a schematic block diagram of an image sensor including a general ramp signal generator.

With reference to FIG. 1, an image sensor 10 includes a pixel array 11, a row driver 12 operatively coupled to the pixel array, an analog-to-digital converter (ADC) 13 operatively coupled to the pixel array, and a ramp signal generator 14 operatively coupled to the ADC 13.

The pixel array 11 includes a plurality of light detection elements, such as photo diodes, pinned photo diodes, or the like. The pixel array 11 detects light by using the plurality of light detection elements and converts the detected light into an electrical signal to generate an image signal.

The row driver 12 drives the pixel array 11 by row. For example, the row driver 12 may generate a row selection signal. The pixel array 11 outputs a reset signal and an image signal from a row selected according to the row selection signal provided from the row driver 12.

The ADC 13 converts the image signal output from the pixel array 11 into a digital signal by using a ramp signal Vramp provided from the ramp signal generator 14. For example, the ADC 13 performs correlated double sampling on the reset signal and the image signal output from the pixel array 11 by using the ramp signal Vramp to generate a digital signal.

In this manner, in the image sensor 10, the ADC 13 converts the image signal of pixels into the digital signal by using the ramp signal from the ramp signal generator. Thus, quality of an image is affected by the ramp signal.

Figure 2:
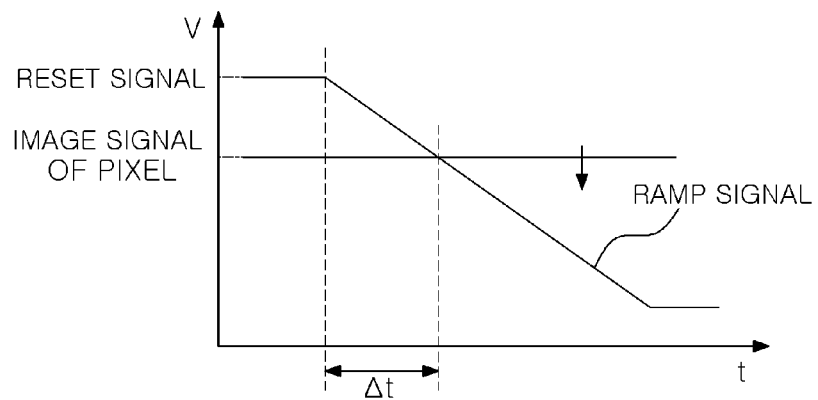
Figure 2:
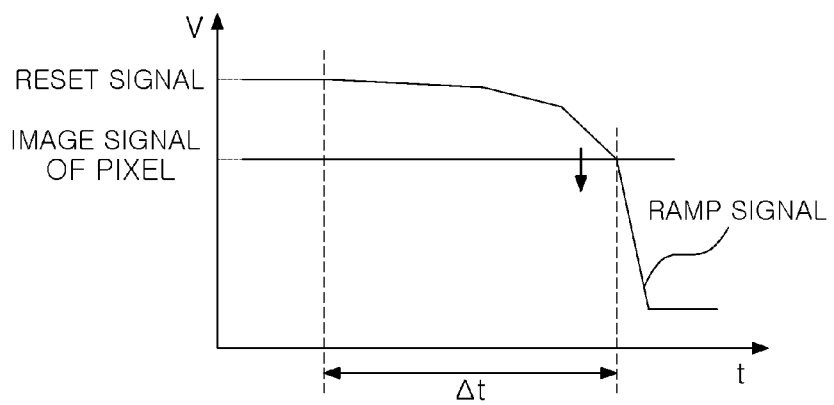

A method for generating a digital signal using a ramp signal will now be described with reference to FIGS. 2(*a*) and 2(*b*). FIGS. 2(*a*) and 2(*b*) are views showing waveforms of ramp signals, in which FIG. 2(*a*) is a graph of the waveform of a ramp signal output from the related art ramp signal generator, and FIG. 2(*b*) is a graph of the waveform of a ramp signal output from a ramp signal generator according to an exemplary embodiment of the present invention.

As shown in FIGS. 2(*a*) and 2(*b*), a ramp signal output of a ramp signal generator begins as a reset signal having a uniform value for a period of time. The reset signal is output initially when the ramp signal generator is reset. After the ramp signal generator is reset, the ramp signal generator output begins to decline as a ramp signal and the output is thereby reduced to a predetermined value. A time $\Delta t$ taken for an image signal of a pixel to be equal to the ramp signal corresponds to the difference between the reset signal of the pixel and the image signal. A digital signal with respect to the image signal of the pixel can be generated by converting the time $\Delta t$ into a digital signal. Thus, because the size of the time $\Delta t$ varies according to the image signal, a digital signal corresponding to the image signal of the pixels can be generated by converting the time $\Delta t$ into the digital signal. In this case, the time $\Delta t$ is shortened in a portion where pixels are darker, and the time $\Delta t$ is lengthened in a portion where pixels are brighter.

In FIG. 2(*a*), because the ramp signal has a certain slope, when a brighter portion of pixels and darker portion of pixels coexist in an image, it is difficult to read a fine difference between a portion of brighter pixels and a portion of darker pixels. However, in an exemplary embodiment of the present invention, when the ramp signal is nonlinearly generated as shown in FIG. 2(*b*), a fine difference between the portion in which pixels are darker can be more minutely read, and the portion in which pixels are brighter can be discriminated.

In other words, the slope of the portion of the ramp signal corresponding to the portion of the darker pixels is adjusted to be gentle, while the slope of the portion of the ramp signal corresponding to the portion of the brightest pixels is adjusted to be steep, thereby allowing for minutely reading the portion of the brighter pixels, as well as the portion of the darker pixels. Thus, by converting the image signal of pixels into a digital signal by using the ramp signal generated from the ramp signal generator according to an exemplary embodiment of the present invention, a dynamic range of an image sensor using the ramp signal generator can be extended.

Figure 3:
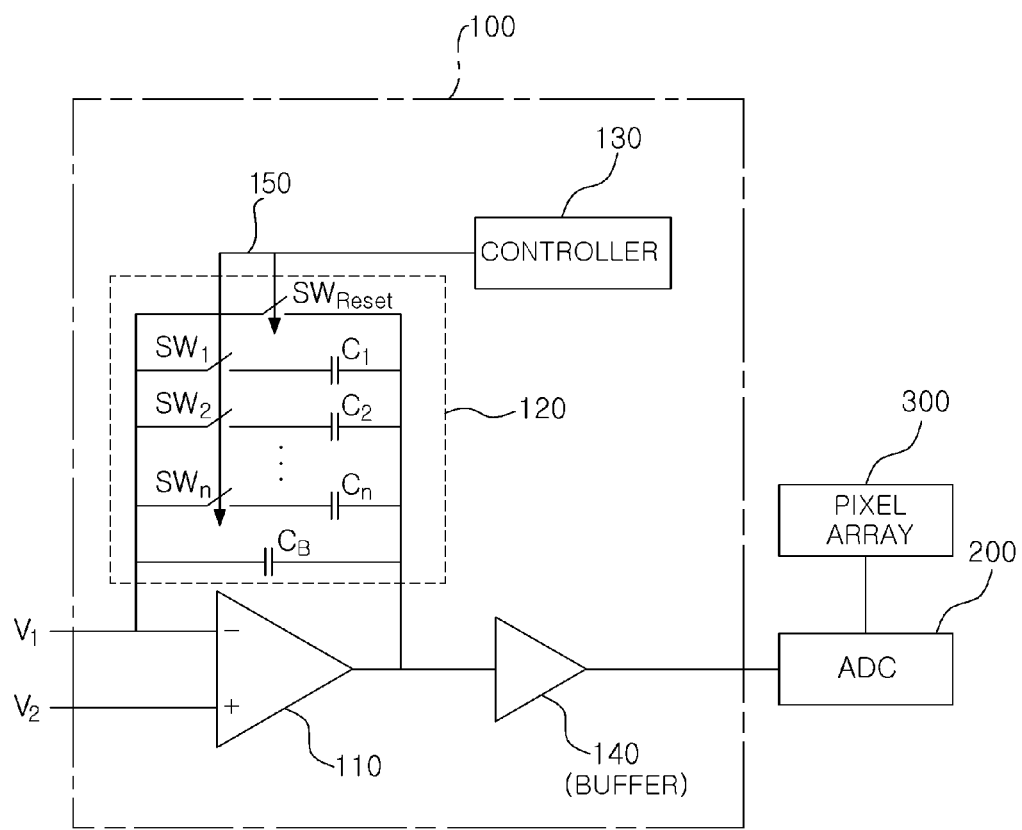
FIG. 3 is a schematic block diagram of a ramp signal generator according to an exemplary embodiment of the present invention.

The ramp signal generator according to an exemplary embodiment of the present invention will now be described with reference to FIG. 3. FIG. 3 is a schematic block diagram of a ramp signal generator according to an exemplary embodiment of the present invention.

As shown in FIG. 3, a ramp signal generator 100 according to an exemplary embodiment of the present invention includes a comparator 110, a ramp signal adjustment unit 120 operatively coupled to the comparator 110, and a controller 130, operatively coupled to the ramp signal adjustment unit 120.

The comparator 110 includes an inversion input terminal (namely, a first input terminal) into which a first bias voltage V1 is input, a non-inversion input terminal (namely, a second input terminal) into which a second bias voltage V2 is input, and an output terminal from which a ramp signal Vramp is output.

The ramp signal adjustment unit 120 is connected between the inversion input terminal of the comparator 110 and the output terminal of the comparator 110. The ramp signal adjustment unit 120 includes a plurality of switched capacitors. Each switched capacitor, of the plurality of switched capacitors, includes a corresponding switch, SW1 to SWn, and a corresponding capacitor, C1 to Cn, where each corresponding switch and capacitor are connected in series. For example, a first switched capacitor includes a switch SW1 connected in series with a capacitor C1. The plurality of switched capacitors are connected in parallel between the inversion input terminal of the comparator 110 and the output terminal of the comparator 110.

The ramp signal adjustment unit 120 may further include a reset switch $SW_{reset}$ connected in parallel to the plurality of switched capacitors. The reset switch $SW_{reset}$ is operative to reset the ramp signal adjustment unit 120 according to, or in response to, a reset control signal from the controller 130, and according to a base capacitor $C_B$ which is also connected in parallel to the plurality of switched capacitors. It is to be understood however that the specific implementation of the ramp signal adjustment unit 120 may be accomplished in various ways in the various embodiments to achieve the operation of the ramp signal adjustment unit 120 as discussed herein. Therefore the details of the ramp signal adjustment unit 120 embodiment herein described is exemplary and is not to be construed as limiting how the ramp signal adjustment unit 120 may be configured in other embodiments.

The controller 130 adjusts capacitance between the inversion input terminal of the comparator 110 and the output terminal of the comparator 110 by switching the switches, SW1 to SWn, included in the ramp signal adjustment unit 120. In particular, the controller 130 switches the switches included in the ramp signal adjustment unit 120 such that the ramp signal output from the comparator 110 is changed from a gentle slope to a steep slope over time. In addition, the controller 130 supplies a reset control signal to the reset switch $SW_{reset}$.

The ramp signal generator 100 may further include a buffer 140 connected to the output terminal of the comparator 110 to buffer the ramp signal and provide the buffered ramp signal as input to the ADC 200.

The operation of the ramp signal generator 100 will now be described in detail with reference to FIG. 3.

First, the controller 130 supplies a reset control signal to the reset switch $SW_{reset}$ of the ramp signal adjustment unit 120. In a state in which the reset switch $SW_{reset}$ is turned on, the signal output by the comparator 110 has the same voltage value as the voltage input to the inversion input terminal, that is, as the value of the reset signal of pixels. When the reset switch $SW_{reset}$ transitions from the ON state to an OFF state according to, (i.e. in response to), the reset control signal, the comparator 110 starts to output the ramp signal. At this moment, all the switches SW1 to SWn of the plurality of switched capacitors are switched to become closed. Preferably, when the reset switch $SW_{reset}$ is turned on by the reset control signal, the controller 130 controls the switches SW1 to SWn of the plurality of switched capacitors to be turned on.

At this time, the comparator 110 and the ramp signal adjustment unit 120 constitute an integrator to integrate the difference between the first bias voltage V1 and the second bias voltage V2 and supply the integrated difference as the ramp signal.

Thereafter, the switches SW1 to SWn of the plurality of switched capacitors are sequentially open. That is, the controller 130 is operatively coupled to the switches SW1 to SWn of the plurality of switched capacitors, by control lines 150 such that the controller 130 may send control signals to sequentially open (or close) switches SW1 to SWn. As the switches SW1 to SWn of the plurality of switched capacitors are sequentially open, the capacitance of the ramp signal adjustment unit 120 is sequentially reduced. Meanwhile, the slope of a signal output from the integrator is in inverse proportion to the capacitance connected between the output terminal and the inversion terminal of the comparator. Thus, because the capacitance of the ramp signal adjustment unit 120 is sequentially reduced, the slope of the ramp signal provided from the output terminal of the comparator 110 gradually becomes steep. When all the switches of the plurality of switched capacitors are open, only the base capacitor $C_B$ is connected between the inversion input terminal of the comparator 110 and the output terminal of the comparator 110.

According to an operation such as that described above, an initial slope of the ramp signal is determined by the sum of the capacitance of all the capacitors C1-Cn and $C_B$ including the base capacitor $C_B$ of the ramp signal adjustment unit 120, and the slope gradually becomes steep with the lapse of time. A final slope of the ramp signal is determined by the capacitance of the base capacitor $C_B$.

Accordingly, the ramp signal having such a wave form as shown in FIG. 2(b) can be outputted by adjusting the magnitudes of the first and second bias voltages V1 and V2, the ON/OFF timing of the switches SW1 to SWn of the ramp signal adjustment unit 120, and the capacitance of the capacitors C1 to Cn of the ramp signal adjustment unit 120 as intended. In other words, the ramp signal illustrated in FIG. 2(b) exhibits a non-linear characteristic, that is, a non-linear interval, during a time interval Δt, prior to the steep slope portion (the steep slope interval), and therefore the dynamic range of pixels is enhanced or extended for an image sensor using the embodiments disclosed herein.

The generated ramp signal may be buffered by the buffer 140 and then supplied to the ADC 200 included in the image sensor. The ADC 200 may receive a reset signal and an image signal of each pixel provided in the pixel array 300 and may perform CDS (Correlated Double Sampling) on the reset signal and the image signal by using the ramp signal to generate a digital signal.

In this manner, because a ramp signal having a gentler slope is applied to the pixels corresponding to a darker portion of an image, a fine difference between the pixels corresponding to the darker portion can be easily discriminated, thus improving image quality and extending a dynamic range of the pixels.

As set forth above, according to exemplary embodiments of the invention, because a ramp signal provided to an ADC in an image sensor has nonlinear characteristics, a dynamic range of pixels can be extended.

While the present invention has been shown and described in connection with the exemplary embodiments, it will be apparent to those skilled in the art that modifications and variations can be made without departing from the spirit and scope of the invention as defined by the appended claims.

What is claimed is:

1. A ramp signal generator for converting an image signal of a pixel into a digital signal, comprising:
   a comparator operative to output a ramp signal by comparing a reset voltage input to an inversion input terminal and a bias voltage input to a non-inversion input terminal;
   a ramp signal adjustment unit connected in parallel between a first input terminal of the comparator and an output terminal of the comparator; and
   a controller operatively coupled to the ramp signal adjustment unit, operative to adjust the ramp signal output from the comparator such that the ramp signal includes a nonlinear interval,
   wherein a first slope of a first signal portion of the ramp signal corresponding to a first pixel portion of a darker pixel is adjusted to be gentle, while a second slope of a second signal portion of the ramp signal corresponding to a second pixel portion of a brighter pixel is adjusted to be steep, and
   wherein the reset voltage has same value as the value of a reset signal of the pixel.

2. The ramp signal generator of claim 1, further comprising a buffer connected to the output terminal of the comparator, operative to buffer the ramp signal.

3. The ramp signal generator of claim 1, wherein the ramp signal adjustment unit comprises a plurality of switched capacitors connected in parallel; and
   wherein the controller is further operative to sequentially switch the plurality of switched capacitors.

4. The ramp signal generator of claim 3, wherein the ramp signal adjustment unit comprises:
   a reset switch connected in parallel to the plurality of switched capacitors, operative to reset the ramp signal adjustment unit in response to a control signal from the controller; and
   a base capacitor connected in parallel to the plurality of switched capacitors.

5. The ramp signal generator of claim 4, wherein each switched capacitor of the plurality of switched capacitors comprises a switch and a capacitor connected in series;
   wherein the controller is further operative to close the reset switch and to close all switches of the plurality of switched capacitors while the reset switch is closed; and
   wherein the controller is further operative to sequentially open each switch of the plurality of switched capacitors when the reset switch is open.

6. An image sensor comprising:
   a pixel array, operative to generate a reset signal and an image signal;
   a ramp signal generator, operative to output a ramp signal having a non-linear interval; and
   an analog-to-digital converter (ADC), operatively coupled to the pixel array and to the ramp signal generator, operative to perform correlated double sampling on the reset signal and the image signal by using the ramp signal to generate a digital signal, wherein the ramp signal generator comprises a comparator, operative to output a ramp signal by comparing a reset voltage input to an inversion input terminal and a bias voltage input to a non-inversion input terminal;

a ramp signal adjustment unit, comprising a plurality of parallel connected switched capacitors, connected in parallel between a first input terminal of the comparator and an output terminal of the comparator; and a controller, operatively coupled to the ramp adjustment unit, operative to control the plurality of switched capacitors to adjust the ramp signal output from the comparator such that the ramp signal includes a nonlinear interval, wherein a first slope of a first signal portion of the ramp signal corresponding to a first pixel portion of a darker pixel is adjusted to be gentle, while a second slope of a second signal portion of the ramp signal corresponding to a second pixel portion of a brighter pixel is adjusted to be steep, wherein the reset voltage has same value as the value of the reset signal.

7. An image sensor, comprising the ramp signal generator of claim 1.

8. A ramp signal generator for converting an image signal of a pixel into a digital signal, comprising:

a ramp signal adjustment unit; and a controller, operatively coupled to the ramp signal adjustment unit, operative to adjust a ramp signal output of the ramp signal generator, such that the ramp signal output includes a nonlinear interval, wherein a first slope of a first signal portion of the ramp signal corresponding to a first pixel portion of a darker pixel is adjusted to be gentle, while a second slope of a second signal portion of the ramp signal corresponding to a second pixel portion of a brighter pixel is adjusted to be steep.

9. An image sensor comprising the ramp signal generator of claim 8.

10. The ramp signal generator of claim 8, comprising:

a comparator, operatively coupled in parallel to the ramp signal adjustment unit, the comparator operative to provide the ramp signal output.

11. The ramp signal generator of claim 8, wherein the controller is operative to adjust capacitance of the ramp signal adjustment unit.

12. The ramp signal generator of claim 11, wherein the controller is operative to adjust the capacitance of the ramp signal adjustment unit to adjust the ramp signal output to include the nonlinear interval.

13. The ramp signal generator of claim 12, wherein the controller is operative to adjust the capacitance of the ramp signal adjustment unit to adjust the ramp signal output to include the nonlinear interval and a linear interval.

14. The ramp signal generator of claim 13, wherein the ramp signal adjustment unit comprises a plurality of parallel connected switched capacitors.

15. The ramp signal generator of claim 14, wherein each switched capacitor of the plurality of parallel connected switched capacitors comprises a switch and a capacitor connected in series.

16. The ramp signal generator of claim 14, wherein the ramp signal adjustment unit further comprises a reset switch connected in parallel with the plurality of switched capacitors.

17. The ramp signal generator of claim 16, wherein the ramp signal adjustment unit further comprises a base capacitor connected in parallel with the plurality of switched capacitors.

18. The ramp signal generator of claim 14, wherein the controller is operative to adjust the capacitance of the ramp signal adjustment by controlling each of the switched capacitors sequentially.

* * * * *